US 11,398,766 B2
Jul. 26, 2022

(12) United States Patent
Abe et al.

(54) POWER CONVERSION DEVICE

(71) Applicant: DENSO CORPORATION, Kariya (JP)

(72) Inventors: Tatsuya Abe, Kariya (JP); Hiroyasu Sugiura, Kariya (JP)

(73) Assignee: DENSO CORPORATION, Kariya (JP)

( * ) Notice: Subject to any disclaimer, the term of this patent is extended or adjusted under 35 U.S.C. 154(b) by 230 days.

(21) Appl. No.: 16/874,656

(22) Filed: May 14, 2020

(65) Prior Publication Data

US 2020/0366168 A1 Nov. 19, 2020

(30) Foreign Application Priority Data

May 17, 2019 (JP) .............................. JP2019-093616

(51) Int. Cl.
*H02K 11/33* (2016.01)
*B62D 5/04* (2006.01)
(Continued)

(52) U.S. Cl.
CPC ............. *H02K 11/33* (2016.01); *B62D 5/046* (2013.01); *H02K 3/28* (2013.01); *H02K 5/225* (2013.01);
(Continued)

(58) Field of Classification Search
CPC ................ A61B 17/70; A61B 17/7065; A61B 2017/00557; A61B 17/00234; A61B 17/7067; A61B 2017/564; B62D 5/046; G11C 7/22; G11C 7/222; H02K 11/27; H02K 11/33; H02K 11/40; H02K 2211/03; H02K 3/28; H02K 5/225; H02M 7/003;
(Continued)

(56) References Cited

U.S. PATENT DOCUMENTS

2012/0286602 A1* 11/2012 Uchida .................. H02K 11/33
310/71
2016/0036289 A1* 2/2016 Kawata ................ B62D 5/0463
310/71
(Continued)

FOREIGN PATENT DOCUMENTS

JP 2011-89903 A 5/2011
JP 2013-232654 A 11/2013

OTHER PUBLICATIONS

U.S. Appl. No. 16/874,651, filed May 14, 2020, Kurihara et al.
U.S. Appl. No. 16/874,652, filed May 14, 2020, Sugiura.
U.S. Appl. No. 16/874,655, filed May 14, 2020, Sugiura.

*Primary Examiner* — Naishadh N Desai
(74) *Attorney, Agent, or Firm* — Maschoff Brennan

(57) ABSTRACT

A power conversion device comprises: a power conversion circuit that converts a supplied electric power; a current detection circuit that detects a current; a control circuit that controls an operation of the power conversion circuit; and a multilayer substrate that is provided with the power conversion circuit, the current detection circuit, and the control circuit. The multilayer substrate includes a printed wiring, and the printed wiring includes a transmission pattern that transmits a detection signal detected by the current detection circuit to the control circuit. An on-off fluctuation unit of the power conversion circuit fluctuates. The whole of the transmission pattern is disposed at a position different from the on-off fluctuation unit in a direction perpendicular to a plate surface of the multilayer substrate.

9 Claims, 11 Drawing Sheets

(51) Int. Cl.
*H02K 11/40* (2016.01)
*H02K 3/28* (2006.01)
*H02K 5/22* (2006.01)
*H02M 7/53* (2006.01)
*H05K 1/18* (2006.01)

(52) U.S. Cl.
CPC .............. *H02K 11/40* (2016.01); *H02M 7/53* (2013.01); *H05K 1/181* (2013.01); *H02K 2211/03* (2013.01); *H05K 2201/10015* (2013.01); *H05K 2201/10166* (2013.01); *H05K 2201/10431* (2013.01)

(58) Field of Classification Search
CPC ....... H02M 7/53; H05K 1/0298; H05K 1/181; H05K 2201/10015; H05K 2201/1009; H05K 2201/10151; H05K 2201/10166; H05K 2201/10431; H05K 2201/10545
See application file for complete search history.

(56) References Cited

U.S. PATENT DOCUMENTS

2017/0373488 A1   12/2017  Saito et al.
2020/0036269 A1*  1/2020  Sugiura .............. H05K 7/20854
2020/0366167 A1*  11/2020  Sugiura .................... B62D 5/04

* cited by examiner

POWER CONVERSION DEVICE

CROSS REFERENCE TO RELATED APPLICATION

This application is based on Japanese Patent Application No. 2019-093616 filed on May 17, 2019, the disclosure of which is incorporated herein by reference.

TECHNICAL FIELD

The present disclosure relates to a power conversion device for converting a supplied power to output the converted power.

BACKGROUND

A related art discloses a power conversion device that converts a supplied DC (direct current) power into an AC (alternating current) power to output the AC power. This type of the power conversion device includes an inverter circuit, a current detection circuit, and a control circuit. The current detection circuit detects a current flowing through the inverter circuit. The control circuit controls the operation of the inverter circuit based on a current detection value by the current detection circuit.

SUMMARY

The present disclosure describes a power conversion device comprising: a power conversion circuit to convert a supplied electric power; a current detection circuit; a control circuit to control an operation of the power conversion circuit based on a current value; and a multilayer substrate that is provided with the power conversion circuit, the current detection circuit, and the control circuit.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
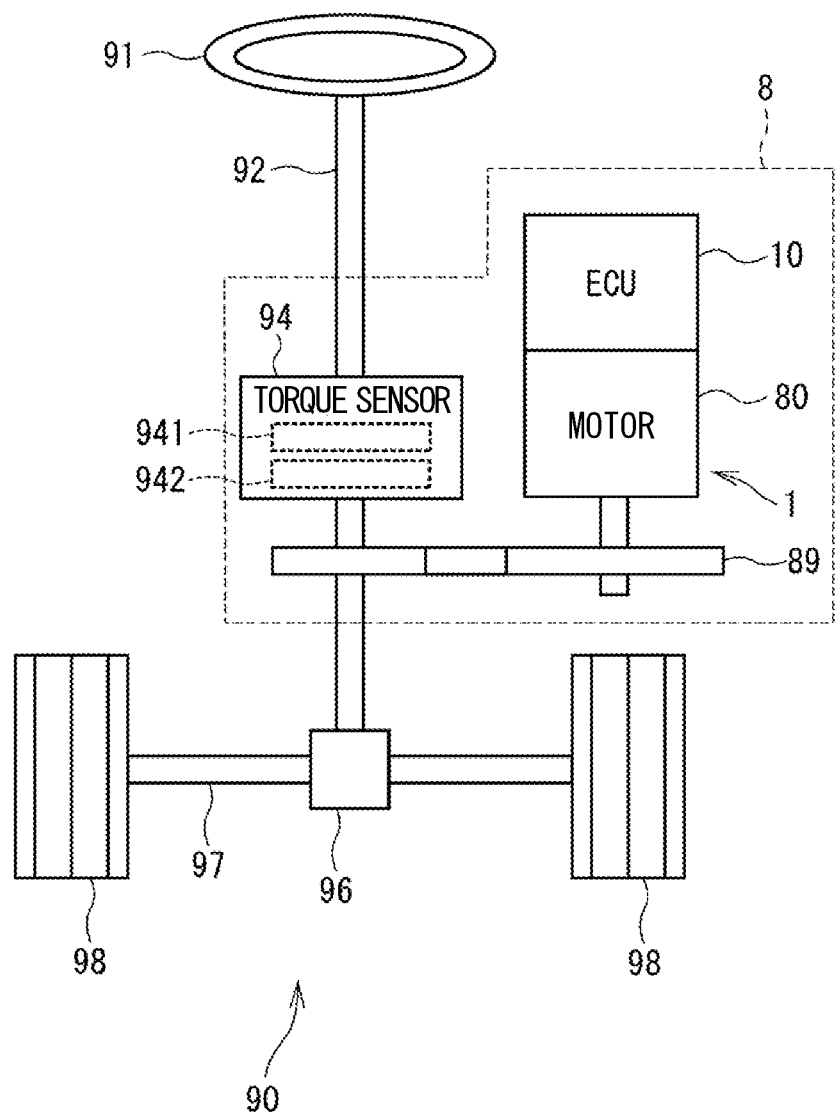
FIG. 1 is a schematic configuration diagram showing a steering system according to a first embodiment.

In a power conversion device that converts a supplied DC power into an AC power to output the AC power, if an inverter circuit, a current detection circuit, and a control circuit are provided on one common multilayer substrate, a device can be miniaturized. The components of the respective circuits and the printed wiring patterns may be densely disposed. In this case, the printed wiring pattern includes a transmission pattern for transmitting a detection signal detected by the current detection circuit to the control circuit. The detection signal transmitted by the transmission pattern may generate noise caused by an influence of the inverter circuit due to the dense placement. The accuracy of the current detection value used in the control circuit may be deteriorated.

The present disclosure describes a power conversion device that reduces noise generated in a current detection value while miniaturizing the device.

According to one aspect of the present disclosure, a power conversion device comprises: a power conversion circuit that is configured to convert a supplied electric power to output the converted power; a current detection circuit that is configured to detect a current flowing through the power conversion circuit; a control circuit that is configured to control an operation of the power conversion circuit based on a current value detected by the current detection circuit; and a multilayer substrate that is provided with the power conversion circuit, the current detection circuit, and the control circuit. The multilayer substrate includes a printed wiring. The printed wiring includes a transmission pattern that transmits a detection signal detected by the current detection circuit to the control circuit. An on-off fluctuation unit of the power conversion circuit fluctuates to switch on and off a current. The whole of the transmission pattern is disposed at a position different from the on-off fluctuation unit in a direction perpendicular to a plate surface of the multilayer substrate.

According to the device of the present disclosure, a power conversion circuit, a current detection circuit, and a control circuit are provided on one substrate, and a multilayer substrate is used as the substrate. For that reason, the printed wiring patterns of the circuits can be disposed so as to overlap with each other when viewed from the plate surface perpendicular direction of the multilayer substrate. This makes it possible to miniaturize the device. With the miniaturization described above, a wiring pattern for a large current in the power conversion circuit and a wiring pattern for control in the control circuit are densely disposed. In the above-mentioned device, measures are taken to reduce the deterioration of the accuracy of the current detection due to the dense placement.

In the power conversion circuit, there are a portion (on-off fluctuation unit) that fluctuates so that a current is switched on-off, and a portion (non-fluctuation portion) in which a constant current flows at all times. In the situation of the dense placement described above, it may be effective as noise countermeasures to prevent the transmission pattern for transmitting the detection signal to the control circuit from being overlapped with the on-off fluctuation unit when viewed from the plate surface perpendicular direction. In the device focused on the noise countermeasures, the whole transmission pattern included in the printed wiring is disposed at a position different from the on-off fluctuation unit when viewed from the plate surface perpendicular direction. For that reason, noise caused by the influence of the on-off fluctuation unit can be inhibited from occurring in the detection signal transmitted in the transmission pattern. Therefore, the deterioration of the accuracy of the current detection can be inhibited while reducing the size of the device.

Multiple embodiments according to the present disclosure will be described with reference to the drawings. Incidentally, the same reference numerals are assigned to corresponding components in each embodiment, and therefore duplicate descriptions may be omitted. When only a part of the configuration is described in each embodiment, the configuration of the other embodiments described above can be applied to other parts of the configuration.

First Embodiment

As shown in FIG. 1, a drive device 1 according to the present embodiment includes an electric motor 80 and an electronic control unit (ECU) 10 as a power conversion device. The drive device 1 is applied to an electric power steering device (EPS) 8 for assisting steering operation of a vehicle. FIG. 1 shows an entire configuration of a steering system 90 including the EPS 8. The steering system 90 includes a steering wheel 91 as a steering member, a steering shaft 92, a pinion gear 96, a rack shaft 97, wheels 98, the EPS 8, and the like.

The steering wheel 91 is connected to the steering shaft 92. The steering shaft 92 is provided with a torque sensor 94 for detecting a steering torque. The torque sensor 94 has two torque detection units 941 and 942 provided for each system. Detection values of the torque detection units 941 and 942 are output to the microcomputers 170 and 270, which are corresponding microcomputers (see FIG. 3). The pinion gear 96 is provided at a tip of the steering shaft 92. The pinion gear 96 meshes with the rack shaft 97. The pair of wheels 98 is connected to both ends of the rack shaft 97 through tie rods or the like.

When a driver rotates the steering wheel 91, the steering shaft 92 connected to the steering wheel 91 rotates. A rotational motion of the steering shaft 92 is converted into a linear motion of the rack shaft 97 by the pinion gear 96. The pair of wheels 98 are steered to an angle corresponding to the amount of displacement of the rack shaft 97.

The EPS 8 includes the drive device 1, a reduction gear 89 as a power transmission portion for reducing a rotational speed of the motor 80 and transmitting the rotational speed to the steering shaft 92. The steering shaft 92 is a drive target of the EPS 8.

Figure 2:
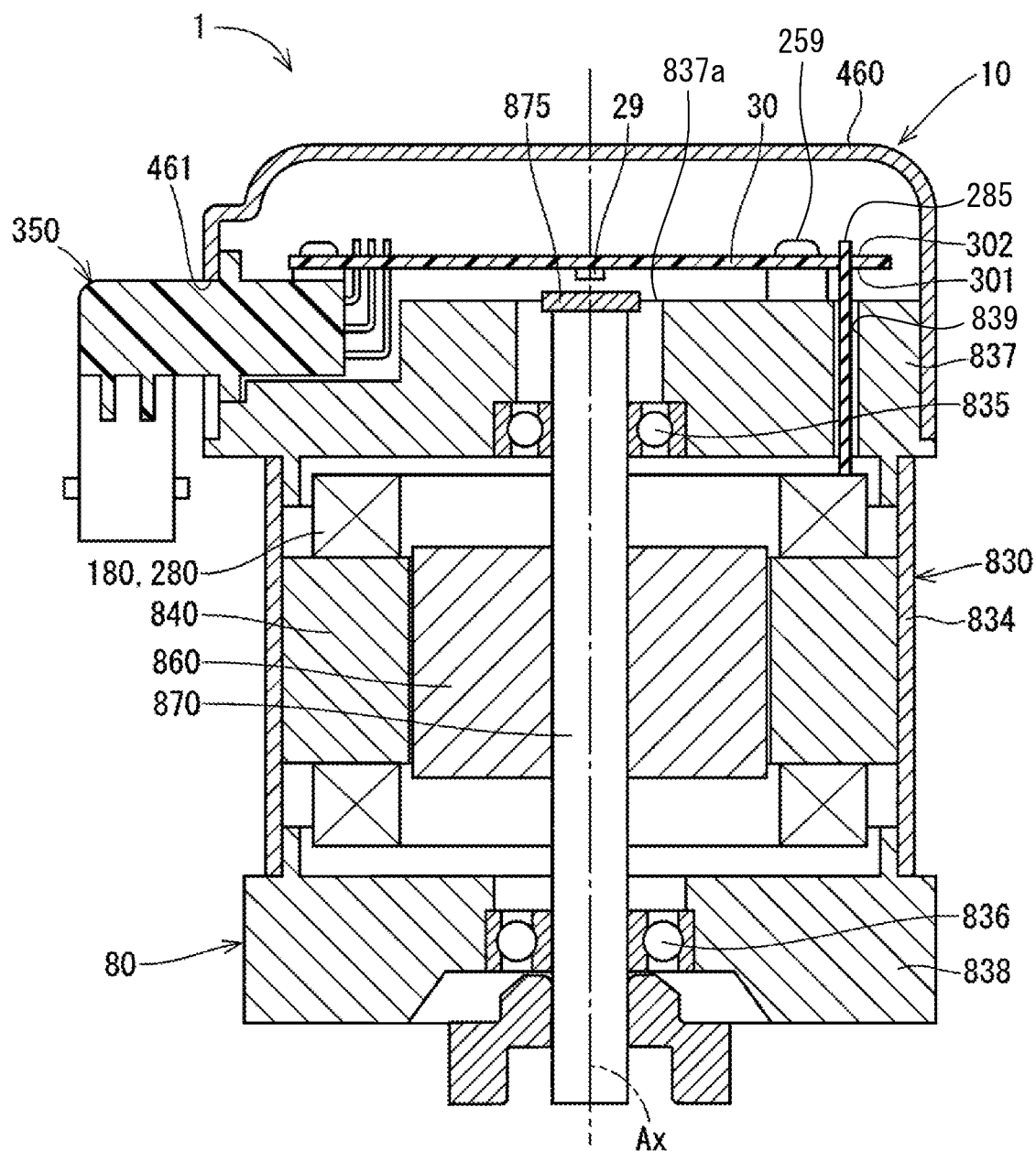
FIG. 2 is a cross-sectional view of a drive device applied to the steering system shown in FIG. 1.
Figure 3:
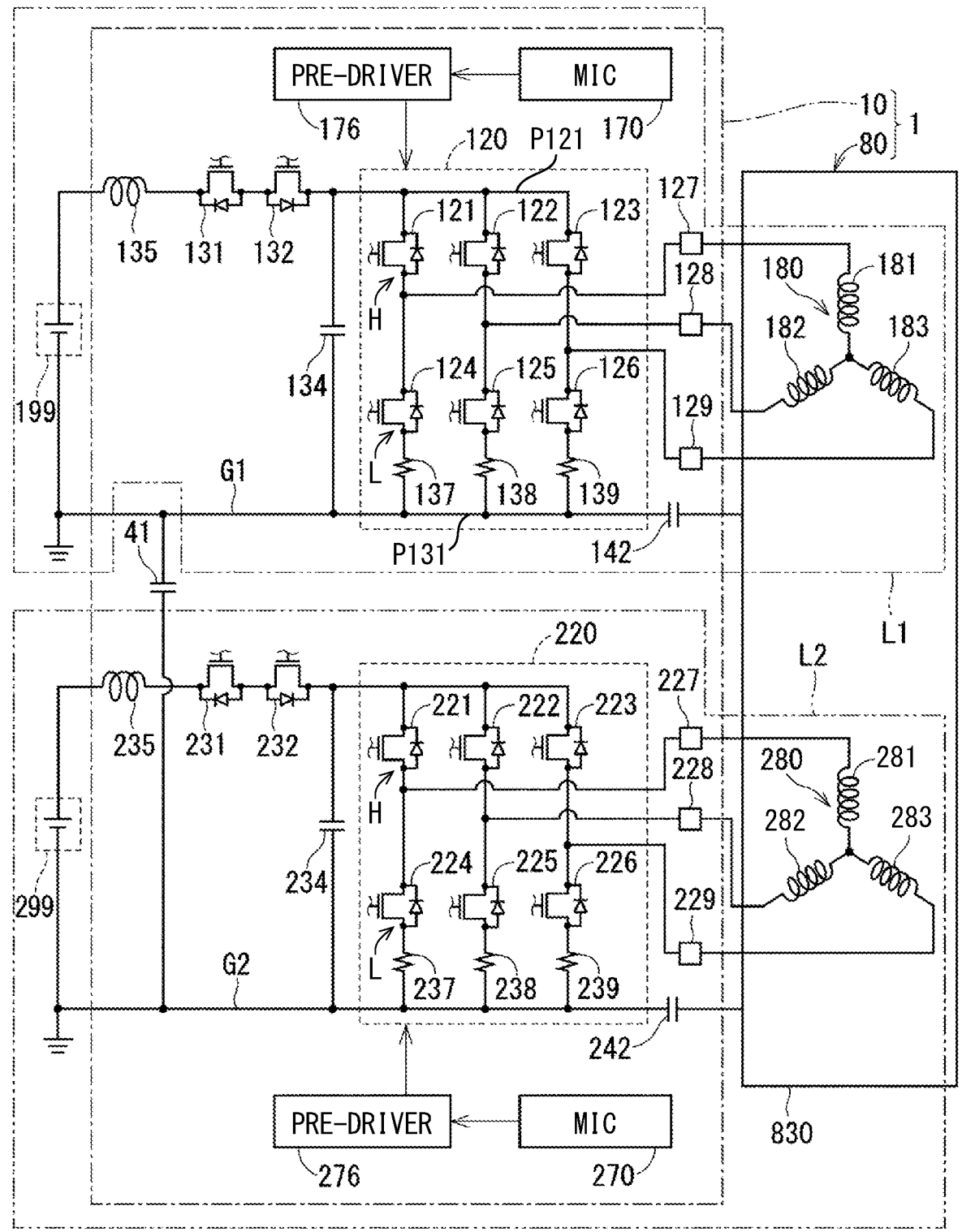
FIG. 3 is a circuit diagram of the drive device shown in FIG. 2.

As shown in FIGS. 2 and 3, the motor 80 is a three-phase brushless motor. The motor 80 outputs part or all of a torque required for steering, and is driven by a power supplied from batteries 199 and 299 to rotate the reduction gear 89 forward and backward.

The motor 80 has a first winding 180 and a second winding 280 as a winding set. The windings 180 and 280 have equivalent electrical characteristics and are cancel-wound on a common stator 840 with electrical angles shifted by 30 [deg] from each other. In response to the above configuration, the windings 180 and 280 are controlled to be energized with a phase current whose phase φ is shifted by 30 [deg].

Hereinafter, a combination of configurations relating to the energization control of the first winding 180 is referred to as a first system L1. A combination of configurations relating to the energization control of the second winding 280 is referred to as a second system L2. The configuration of the first system L1 is mainly numbered in the 100's, the configuration of the second system L2 is mainly numbered in the 200's, and the configurations substantially similar to each other in the systems L1 and L2 are numbered so that the last two digits are the same, and a description of those configurations will be omitted as appropriate.

As shown in FIG. 2, the drive device 1 has the ECU 10 integrally provided on one side of the motor 80 in an axial direction, which is so-called "electromechanical integrated type" or "machine/electricity integral type". The ECU 10 is provided on the other side of the reduction gear 89 with respect to the motor 80. The ECU 10 is disposed coaxially with a center line Ax of a rotation shaft 870. With the electromechanical integrated type, the ECU 10 and the motor 80 can be efficiently placed in a vehicle having a limited mounting space. Hereinafter, when simply referred to as "axial direction" or "radial direction" as appropriate, the axial direction or the radial direction of the motor 80 is meant.

The motor 80 includes a stator 840, a rotor 860, a rotation shaft 870, and a housing 830 that accommodates the stator 840, the rotor 860, the rotation shaft 870, and the like. The stator 840 is fixed to the housing 830, and the windings 180 and 280 are wound around the stator 840. The rotor 860 is provided radially inward of the stator 840 and rotatable relative to the stator 840.

The rotation shaft 870 is fitted into the rotor 860 and rotates integrally with the rotor 860. The rotation shaft 870 is rotatably supported by the housing 830 by the aid of bearings 835 and 836. An end of the rotation shaft 870 on the ECU 10 side protrudes from the housing 830 toward the ECU 10 side. A magnet 875 as a detection target is provided at the end of the rotation shaft 870 on the ECU 10 side.

The housing 830 has a cylindrical case 834, a rear frame end 837 provided at one end of the case 834, and a front frame end 838 provided at the other end of the case 834.

An opening 837a through which the rotation shaft 870 is inserted and disposed is provided in the rear frame end 837. A lead wire insertion hole 839 is provided in the rear frame end 837. A lead wire 285 connected to each phase of the windings 180 and 280 is inserted into the lead wire insertion hole 839. The lead wire 285 is taken out from the lead wire insertion hole 839 to the ECU 10. The lead wire 285 is inserted through motor wire connection portions 186 and 286 (see FIGS. 4 and 5) and connected to a substrate 30 by solder or the like.

The ECU 10 includes the substrate 30 and various electronic components mounted on the substrate 30. The substrate 30 is fixed to a surface of the rear frame end 837 opposite to the motor 80 by bolts 259 (see FIG. 2) inserted through substrate connection portions 155 and 255. The bolts 259 are made of a conductive material. A surface of the substrate 30 on the motor 80 side is defined as a motor surface 301, and the surface of the substrate 30 on the opposite side to the motor 80 is defined as a cover surface 302. The cover 460 is formed in a substantially bottomed cylindrical shape and fits radially outward of the rear frame end 837. The cover 460 is provided so as to cover the substrate 30, and protects the ECU 10 from an external impact, and prevents entry of dust, water, or the like into the ECU 10. An opening 461 is provided on a side surface of the cover 460.

The connector 350 has connector terminals such as a first power supply terminal, a first ground terminal, a first signal terminal, a second power supply terminal, a second ground terminal, and a second signal terminal. Each of the first power supply terminal, the first ground terminal, and the first signal terminal is inserted from the motor surface 301 side of the substrate 30, and electrically connected to a first power supply terminal connection portion 151, a first ground terminal connection portion 152, and a first signal terminal connection portion 153 (see FIGS. 4 and 5). Each of the second power supply terminal, the second ground terminal, and the second signal terminal is inserted from the motor surface 301 side of the substrate 30, and electrically connected to the second power supply terminal connection portion 251, the second ground terminal connection portion 252, and the second signal terminal connection portion 253 (see FIGS. 4 and 5).

FIG. 3 shows a circuit configuration of the drive device 1. The ECU 10 includes a first inverter 120, first motor relays 127 to 129, first power supply relays 131 and 132, a first capacitor 134, and a first coil 135, which are provided corresponding to the first winding 180. The ECU 10 further includes second inverter 220, second motor relays 227 to 229, second power supply relays 231 and 232, a second capacitor 234, and a second coil 235, which are provided corresponding to the second winding 280.

The first inverter 120 and the like of the first system L1 are supplied with an electric power from the first battery 199. The second inverter 220 and the like of the second system L2 are supplied with an electric power from the second battery 299. In the present embodiment, the ground is also separated by the first system L1 and the second system L2. The first microcomputer 170 controls the energization of the first winding 180, and the second microcomputer 270 controls the energization of the second winding 280. In other words, in the present embodiment, the first system L1 and the second system L2 are provided independently of each other in a completely redundant configuration.

The first inverter 120 is a three-phase inverter, and the first switching elements 121 to 126 are connected in a bridge manner. The switching elements 121 to 123 are connected to a high potential side to form an upper arm H. The switching elements 124 to 126 are connected to a low potential side to form a lower arm L. A connection point of the paired U-phase switching elements 121 and 124 is connected to one end of a first U-phase coil 181. A connection point of the paired V-phase switching elements 122 and 125 is connected to one end of a first V-phase coil 182. A connection point of the paired W-phase switching elements 123 and 126 is connected to one end of a first W-phase coil 183. The other ends of the coils 181 to 183 are connected to each other. Shunt resistors 137 to 139, which are current detection elements for detecting currents flowing in the coils 181 to 183, are provided on the low potential side of the switching elements 124 to 126, respectively. The high potential side may be referred to as a high electric potential side, and the low potential side may be referred to as a low electric potential side.

The second inverter 220 has the same configuration as that of the first inverter 120. In other words, the switching elements 221 to 223 are connected to a high potential side to form an upper arm H. The switching elements 224 to 226 are connected to a low potential side to form a lower arm L. Output points of the upper and lower arm circuits of the respective UVW-phases are connected to the respective UVW-phase coils. Shunt resistors 237 to 239, which are current detection elements for detecting currents flowing in the coils 281 to 283, are provided on the low potential side of the switching elements 224 to 226.

Those shunt resistors 137 to 139 and 237 to 239 correspond to a current detection circuit that detects a current flowing through an arm of each phase. A current value detected by the current detection circuit is input to microcomputers 170 and 270. The microcomputers 170 and 270 correspond to a control circuit that controls the operation of the inverters 120 and 220 based on the current value detected by the current detection circuit.

The first motor relays 127 to 129 are provided between the first inverter 120 and the first winding 180, and are provided so that the first inverter 120 and the first winding 180 can be disconnected from each other and connected to each other. The U-phase motor relay 127 is provided between the connection point of the switching elements 121 and 124 and the U-phase coil 181. The V-phase motor relay 128 is provided between the connection point of the switching elements 122 and 125 and the V-phase coil 182. The W-phase motor relay 129 is provided between the connection point of the switching elements 123 and 126 and the W-phase coil 183. The second motor relays 227 to 229 have the same configuration as that of the first motor relays 127 to 129, and are provided for the respective UVW-phases.

The first power supply relays 131 and 132 are connected in series with each other so that orientations of parasitic diodes are opposite to each other, and are provided between the first battery 199 and the first inverter 120. The second power supply relays 231 and 232 are connected in series with each other so that orientations of parasitic diodes are opposite to each other, and are provided between the second battery 299 and the second inverter 220. This prevents a current from flowing in a reverse direction and protects the ECU 10 if the batteries 199 and 299 are incorrectly connected in the reverse direction.

The pre-driver 176 outputs a drive signal based on a control signal from the first microcomputer 170. The first switching elements 121 to 126, the first motor relays 127 to 129, and the first power supply relays 131 and 132 are controlled to be turned on and off according to the drive signal. The pre-driver 276 of the second system L2 functions in the same manner as the pre-driver 176 of the first system L1. In other words, the second switching elements 221 to 226, the second motor relays 227 to 229, and the second power supply relays 231 and 232 are on-off controlled by the pre-driver 276. In order to avoid complication of the drawings, control lines to the motor relays and the power supply relays are omitted in FIG. 3.

The first capacitor 134 is connected in parallel with the first inverter 120, and the second capacitor 234 is connected in parallel with the second inverter 220. The capacitors 134 and 234 are formed of, for example, aluminum electrolytic capacitors. The first coil 135 is provided between the first battery 199 and the first power supply relay 131, and the second coil 235 is provided between the second battery 299 and the second power supply relay 231.

The first capacitor 134 and the first coil 135, and the second capacitor 234 and the second coil 235 each form a filter circuit. Those filter circuits reduce noise transmitted from other devices sharing the batteries 199 and 299. In addition, the filter circuits reduce the noise transmitted from the drive device 1 to the other devices sharing the batteries 199 and 299. In addition, the capacitors 134 and 234 store electric charges, thereby assisting a power supply to the inverters 120 and 220.

An inter-system ground connection capacitor 41 connects a first system ground G1 and a second system ground G2. A first electromechanical connection capacitor 142 connects the first system ground G1 and the housing 830 of the motor 80. A second electromechanical connection capacitor 242 connects the second system ground G2 and the housing 830. The capacitors 41, 142, and 242 are formed of, for example, ceramic capacitors.

Figure 4:
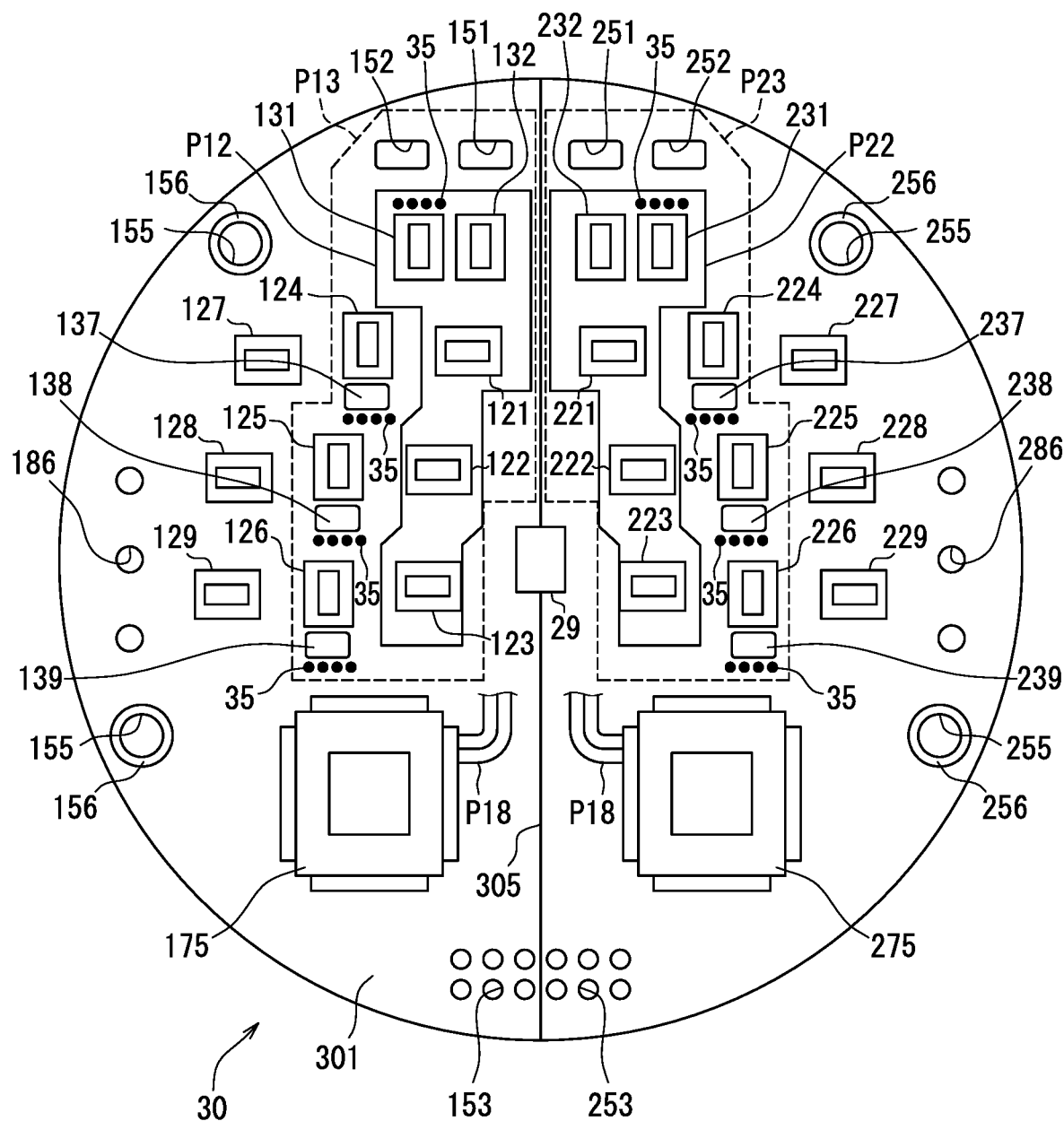
FIG. 4 is a bottom view of an inverter applied to the drive device shown in FIG. 2, when viewed from a side of a motor.
Figure 5:
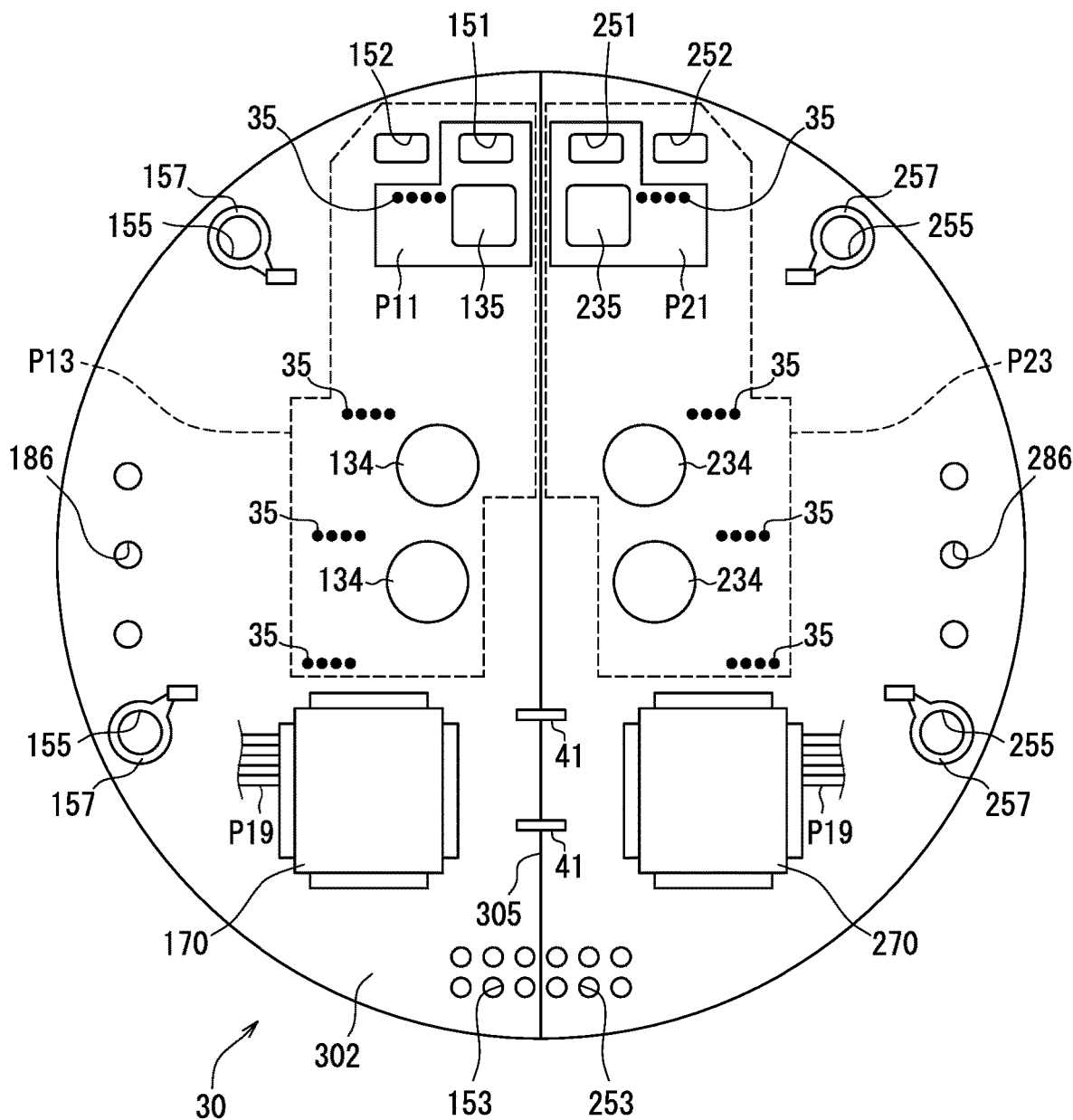
FIG. 5 is a top view of the inverter applied to the drive device shown in FIG. 2, when viewed from an opposite side of the motor.

The motor surface 301 of the substrate 30 is shown in FIG. 4, and the cover surface 302 is shown in FIG. 5. For the sake of description, the placement of the cover surface 302 is reversed, and the first system L1 is shown on a left side and the second system L2 is shown on a right side of a plane of paper.

As shown in FIG. 4, the switching elements 121 to 126 and 221 to 226 and the shunt resistors 137 to 139 and 237 to 239 are mounted on the motor surface 301 of the substrate 30. The motor relays 127 to 129 and 227 to 229, and the power supply relays 131, 132, 231, and 232 are mounted on the motor surface 301. Further, integrated ICs 175 and 275 and a rotation angle sensor 29 (sensor element) are mounted on the motor surface 301. The integrated IC 175 includes the pre-driver 176, and the integrated IC 275 includes the pre-driver 276. The rotation angle sensor 29 detects a change in a magnetic field by the magnet 875 provided on the rotation shaft 870, and outputs a detection signal corresponding to a rotation angle of the rotation shaft 870.

As shown in FIG. 5, the capacitors 134 and 234 and the coils 135 and 235 are mounted on the cover surface 302 of the substrate 30. Further, the inter-system ground connection capacitor 41, the electromechanical connection capacitors 142 and 242 (see FIG. 3), and the microcomputers 170 and 270 are mounted on the cover surface 302.

As shown in FIGS. 4 and 5, the substrate 30 is electrically separated into two pieces by a slit 305. Parts relating to the first system L1 are mounted on the motor surface 301 and the cover surface 302 in one region. Parts relating to the second system L2 are mounted on the motor surface 301 and the cover surface 302 in the other region.

The rotation angle sensor 29 is disposed in a region of the substrate 30 facing the opening 837a of the rear frame end 837. The region of the substrate 30 facing the opening 837a of the rear frame end 837 corresponds to an opening facing region. The rotation angle sensor 29 is mounted across the slit 305 on the motor surface 301. The inter-system ground connection capacitor 41 is mounted across the slit 305 on the cover surface 302, and connects the first system ground G1 and the second system ground G2.

The first electromechanical connection capacitor 142 connects the ground pattern P13 of the first system L1 (see FIG. 5) and the housing connection pattern 157. The second electromechanical connection capacitor 242 connects the ground pattern P23 of the second system L2 (see FIG. 5) and the housing connection pattern 257. The housing 830 is connected to the vehicle ground. In other words, the capacitors 41, 142, and 242 are all capacitors for connecting between the grounds. Further, it is conceivable that the inter-system ground connection capacitor 41 connects between the grounds of the power system circuits of the systems L1 and L2.

In the present embodiment, the drive device 1 is applied to the EPS 8, and a large current is supplied in a short time, so that switching noise and ringing noise may be generated. The noise N described above is generated mainly in a circuit of the ECU 10, and the generated noise may propagate to the vehicle side through the connector 350 and the motor 80. Therefore, the ground of the substrate 30 and the housing 830 are electrically connected to each other by use of bolts to form a noise feedback path from the motor 80 toward the ECU 10. As a result, the noise generated in the circuit of the ECU 10 is fed back to a noise source, and the noise is inhibited from propagating to the vehicle side.

Figure 6:
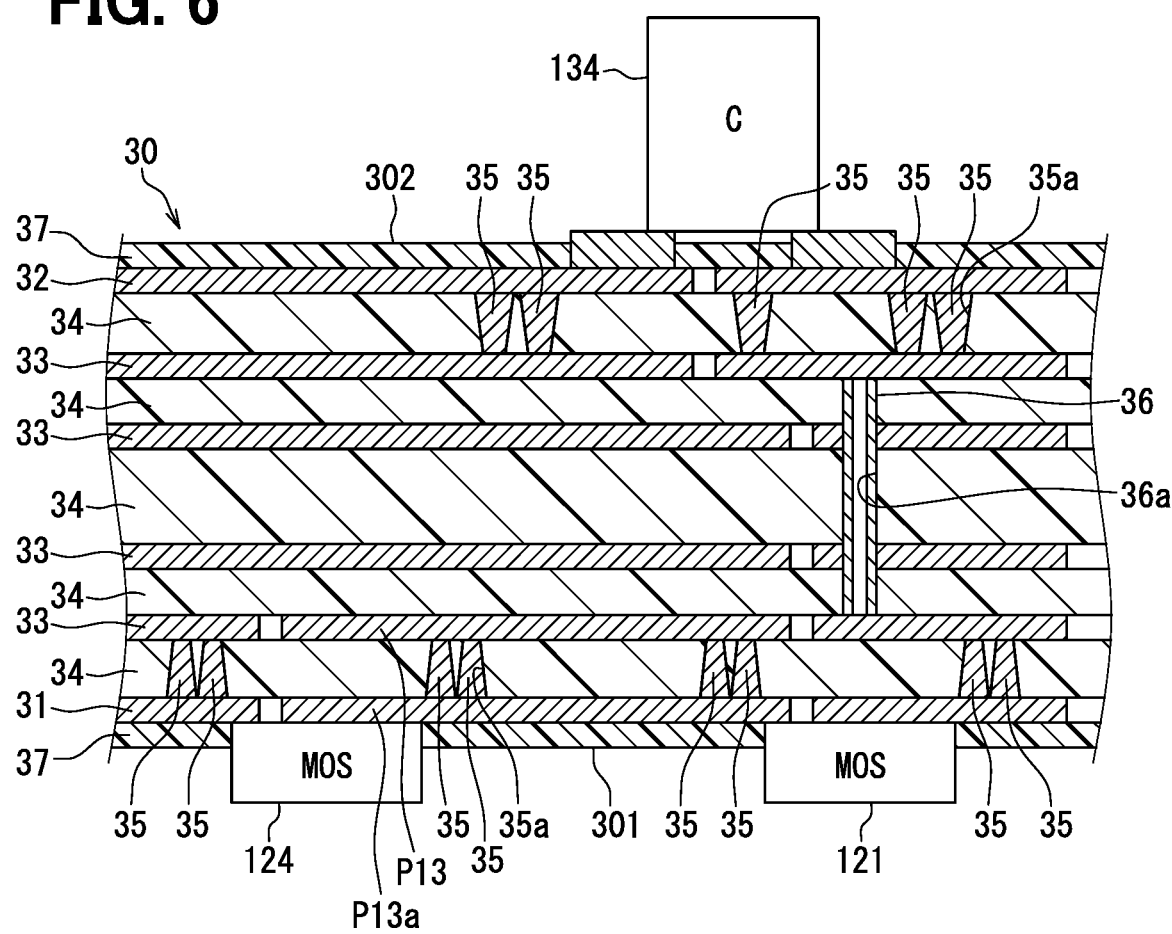
FIG. 6 is a cross-sectional view of the inverter according to the first embodiment.

As shown in FIG. 6, a multilayer substrate is used as the substrate 30 according to the present embodiment. Multiple wiring layers, multiple insulating layers 34, surface resist layers 37, vias, and the like are formed in the substrate 30. Conductive wirings are provided in the wiring layers. The insulating layer 34 having an electrical insulation property is disposed between the adjacent wiring layers.

The wiring layers include surface layers 31 and 32 and inner layers 33. The surface layers 31 and 32 are outermost layers of all the wiring layers. The inner layers 33 are layers located inside the entire wiring layers. In an example of FIG. 6, the inner layers 33 include four layers (that is, multiple layers). The surface layers 31 and 32 are covered with surface resist layers 37. The surface resist layer 37 covering the surface layer 31 forms the motor surface 301. The surface resist layer 37 covering the surface layer 32 forms the cover surface 302.

The vias include through-hole vias (not illustrated) and inner vias 35a and 36a. The through-hole vias are shaped to penetrate through all of the surface layers 31, 32 and the inner layers 33. All of the surface layers 31, 32 and the inner layers 33 may be referred to as all wiring layer. The inner vias 35a are shaped to extend across one of the surface layers 31 and 32 and one inner layer 33 adjacent to the one surface layer. The inner via 36a is shaped to extend across all the inner layers 33 except for the surface layers 31 and 32. The inner vias 35a are provided by laser machining, and the inner via 36a is provided by drilling.

Inner surfaces of the through-hole vias and the inner via 36a are subjected to plating 36 as conductive members. The plating 36 is cylindrically shaped to provide a space inside. A non-conductive member (not shown) is packed inside the cylinder of the inner via 36a. On the other hand, a conductive member is buried in each of the inner vias 35a. The conductive member has a solid shape, and is referred to as a solid via 35 in the following description. The solid vias 35 and the plating 36 electrically connect wiring patterns formed in arbitrary wiring layers. Specific examples of a material of the plating 36 and the solid vias 35 include copper.

A part of the wiring pattern formed in the wiring layer functions as a wiring for connecting the electronic components shown in FIG. 3. The wiring patterns include the ground patterns P13 and P23 and the power supply patterns P11, P12, P21, and P22. Further, the wiring patterns include transmission patterns Prh and Prg, output patterns P124 and P125, and the like, which will be described later with reference to FIG. 7. Those patterns are provided in each of the first system L1 and the second system L2.

(Details of Ground Pattern)

The ground patterns P13 and P23 provide a part of the grounds G1 and G2, and are electrically connected to the ground terminal connection portions 152 and 252. The ground patterns P13 and P23 are electrically connected to the electromechanical connection capacitors 142 and 242 and the inter-system ground connection capacitor 41 in the surface layer 32 on the cover surface 302 side. The respective ground patterns P13 and P23 are electrically connected to low-potential side terminals of the capacitors 134 and 234 and the shunt resistors 137 to 139 and 237 to 239 in the surface layer 31 on the motor surface 301 side.

The ground patterns P13 and P23 shown in FIG. 4 and FIG. 5 are parts of the ground patterns provided in all the wiring layers, and the other ground patterns are omitted in the drawing. The ground patterns P13 and P23 are provided on the inner layer 33.

The ground patterns of the same systems provided in different wiring layers are connected to each other by multiple solid vias 35 and the plating 36. For example, in FIG. 6, the ground pattern P13 of the inner layer 33 and the ground pattern P13 provided on the surface layer 31 are connected to each other by the multiple solid vias 35 and the plating 36. For example, in FIGS. 4 and 5, the ground pattern of the surface layer 31 (not shown) connected to the low-potential side terminals of the shunt resistors 137 to 239 and the ground patterns P13 and P23 of the inner layer 33 are connected to each other by the multiple solid vias 35.

The ground pattern P13 of the first system L1 is shaped to include the whole of the power supply relays 131 and 132, the switching elements 121 to 126, and the shunt resistors 137 to 139 when viewed from the direction perpendicular to the plate surface of the substrate 30. The direction perpendicular to the plate surface of the substrate 30 may be referred to as a plate surface perpendicular direction. Similarly, the ground pattern P23 of the second system L2 is shaped to include the whole of the power supply relays 231 and 232, the switching elements 221 to 226, and the shunt resistors 237 to 239 when viewed from the plate surface perpendicular direction. In other words, all of the components such as the power supply relays 231 and 232, the switching elements 221 to 226, and the shunt resistors 237 to 239 are overlapped with the ground patterns P13 and P23 when viewed from the plate surface perpendicular direction.

The coils 135 and 235 and the capacitors 134 and 234 provided on the cover surface 302 are also entirely overlapped with the ground patterns P13 and P23 when viewed from the plate surface perpendicular direction. The component group overlapped with the ground patterns P13 and P23 among the components provided on the surface layers 31 and 32 is referred to as ground pattern overlapped components. The solid vias 35 connected to the ground pattern overlapped component are also overlapped with the ground patterns P13 and P23. For example, as shown in FIGS. 4 and 5, the solid vias 35 connected to the shunt resistors 237 to 239 and the solid vias 35 connected to the power supply relay 131 are also entirely overlapped with the ground patterns P13 and P23 when viewed from the plate surface perpendicular direction.

(Details of Power Supply Pattern)

The power supply patterns P11 to P22 are connected to the high potential side of the inverters 120 and 220 to supply an electric power. The power supply patterns P11 to P22 of the respective systems are electrically connected to the high-potential side terminals of the capacitors 134 and 234 and the power supply relays 132 and 232 in the surface layer 31 on the motor surface 301 side. The power supply patterns P11 to P22 of the respective systems are electrically connected to the high-potential side terminals of the switching elements 121 to 123 and 221 to 223.

The power supply patterns P11 to P22 shown in FIGS. 4 and 5 are a part of the power supply patterns provided in each of all the wiring layers, and other power supply patterns are omitted in the drawing. The illustrated power supply patterns P11 and P21 are provided on the surface layer 32 on the cover surface 302 side. The illustrated power supply patterns P12 and P22 are provided on the surface layer 31 on the motor surface 301 side.

The power supply patterns of the same systems provided in different wiring layers are connected to each other by the multiple solid vias 35 and the plating 36. For example, in FIGS. 4 and 5, the power supply patterns P12 and P22 of the surface layer 31 to which the first power supply relays 131 and 231 are connected and the power supply patterns P11 and P21 of the surface layer 32 are connected to each other by the multiple solid vias 35 and the plating 36.

The power supply pattern P11 of the first system L1 provided on the surface layer 32 is shaped to include the whole of the power supply terminal connection portion 151 and the coil 135 when viewed from the plate surface perpendicular direction. The power supply pattern P21 of the second system L2 provided on the surface layer 32 is similarly shaped to include the whole of the power supply terminal connection portion 251 and the coil 235 when viewed from the plate surface perpendicular direction. In other words, the whole of the power supply terminal connection portions 151 and 251 and the coils 135 and 235 are overlapped with the power supply patterns P11 and P21 when viewed from the plate surface perpendicular direction.

The power supply pattern P12 of the first system L1 provided on the surface layer 31 is shaped to include the whole of the switching elements 121 to 123 and the power supply relays 131 and 132 when viewed from the plate surface perpendicular direction. In the same manner, the power supply pattern P22 of the second system L2 provided on the surface layer 31 is shaped to include the whole of the switching elements 221 to 223 and the power supply relays 231 and 232 when viewed from the plate surface perpendicular direction. In other words, the switching elements 121 to 223 and the power supply relays 131 to 232 are entirely overlapped with the power supply patterns P12 and P22 when viewed from the plate surface perpendicular direction.

Among the components provided on the surface layer 31, the component group overlapped with the power supply patterns P12 and P22 is referred to as power supply pattern overlapped components. The solid vias 35 connected to the power supply pattern overlapped components are also overlapped with the power supply patterns P12 and P22. For example, as shown in FIGS. 4 and 5, the solid vias 35 connected to the power supply relays 131 and 231 are also overlapped with the power supply patterns P11 to P22 when viewed from the plate surface perpendicular direction.

The ground pattern P13 of the first system L1 is shaped to include the whole of the power supply patterns P11 and P12 of the first system L1 when viewed from the plate surface perpendicular direction. In the same manner, the ground pattern P23 of the second system L2 is shaped to include the whole of the power supply patterns P21 and P22 of the second system L2 when viewed from the plate surface perpendicular direction. In other words, the whole of the power supply patterns P11 to P22 is overlapped with the ground patterns P13 and P23 when viewed from the plate surface perpendicular direction.

Among the multiple wiring layers, when the surface layer 31 on the motor surface 301 side is defined as a "first layer" and the inner layer 33 located adjacent to the first layer is defined as a "second layer", an area of each pattern has the following magnitude relationship. In the first system L1, an area of the second layer ground pattern portion, which is the ground pattern P13 provided in the second layer, is larger than an area of the first layer power supply pattern portion, which is the power supply pattern P12 provided in the first layer.

When the surface layer 32 on the cover surface 302 side is defined as the "first layer", the area of the second layer ground pattern portion, which is the ground pattern P13 provided in the second layer, is larger than the area of the first layer power supply pattern portion, which is the power supply pattern P11 provided in the first layer.

The rotation angle sensor 29 is disposed in a region of the substrate 30 facing the opening 837a through which the rotation shaft 870 is inserted and disposed. The region of the substrate 30 facing the opening 837a through which the rotation shaft 870 is inserted and disposed may be referred to as an opening facing region. The power supply pattern and the ground pattern are disposed at positions not overlapping with the rotation angle sensor 29 when viewed from the plate surface perpendicular direction.

(Details of On-Off Fluctuation Unit)

A circuit configuring the inverters 120 and 220 is referred to as a "power conversion circuit". The power conversion circuit is divided into an "on-off fluctuation unit", a "power supply unit", and an "output unit" which will be described below. In addition, in the example shown in FIG. 7, the power supply pattern P12 is divided into an upper line P121, an upper pattern P122, and a midpoint pattern P123. The ground pattern P13 is divided into a lower line P131 and a lower pattern P132, P133.

The on-off fluctuation unit is a portion of the power conversion circuit which fluctuates so that the on and off of the current is switched. The on-off fluctuation unit includes the switching elements 121 to 123 and 221 to 223 configuring the upper arm H, the switching elements 124 to 126 and 224 to 226 configuring the lower arm L, the shunt resistors 137 to 239, and the wirings connecting those elements.

The wirings of the on-off fluctuation unit include the upper pattern P122, the midpoint pattern P123, and the lower patterns P132 and P133. In other words, a pattern indicated by oblique lines in FIG. 7 corresponds to an on-off fluctuation unit. The lower pattern P132 may be referred to as a first lower pattern, and the lower pattern P133 may be referred to as a second lower pattern.

The upper line P121 is a high potential side portion of the power supply line. The lower line P131 is a low potential side portion of the power supply line and is connected to the ground. The multiple upper arms H are branched and connected to the upper line P121. The multiple lower arms L are branched and connected to the lower line P131.

The upper pattern P122 is shaped to branch from the upper line P121 and extend, and connects the upper line P121 and the switching element 121. One end of the upper pattern P122 is connected to the upper line P121. The other end of the upper pattern P122 is provided with a land Lhd to which a drain terminal of the switching element 121 is connected.

The midpoint pattern P123 connects the switching element 121 of the upper arm H and the switching element 124 of the lower arm L. A switch land portion Lhs to which a source terminal of the switching element 121 is connected is provided at one end of the midpoint pattern P123. The other end of the midpoint pattern P123 is provided with a switch land portion Lld to which a drain terminal of the switching element 124 is connected.

The lower patterns P132 and P133 connect the switching element 124 and the lower line P131 through the shunt resistor 137. The lower pattern P132 is shaped to be branched from the lower line P131 and extend, and connect the lower line P131 and the shunt resistor 137. One end of the lower pattern P132 is connected to the lower line P131. The other end of the lower pattern P132 is provided with a low-potential side land portion Lrg to which the low-potential side terminal of the shunt resistor 137 is connected. One end of the lower pattern P133 is provided with a high-potential side land portion Lrh to which a high-potential side terminal of the shunt resistor 137 is connected. The other end of the lower pattern P133 is provided with a land Lls to which a source terminal of the switching element 124 is connected.

The output pattern P124 connects the midpoints of the switching elements 121 and 124 to the motor relay 127. One end of the output pattern P124 is connected to the switch land portion Lld of the midpoint pattern P123. The other end of the output pattern P124 is provided with a land Los to which a source terminal of the motor relay 127 is connected. The output pattern P125 connects the motor relay 127 and the motor wire connection portion 286. One end of the output pattern P125 is provided with a land Lod to which a drain terminal of the motor relay 127 is connected.

Figure 8:
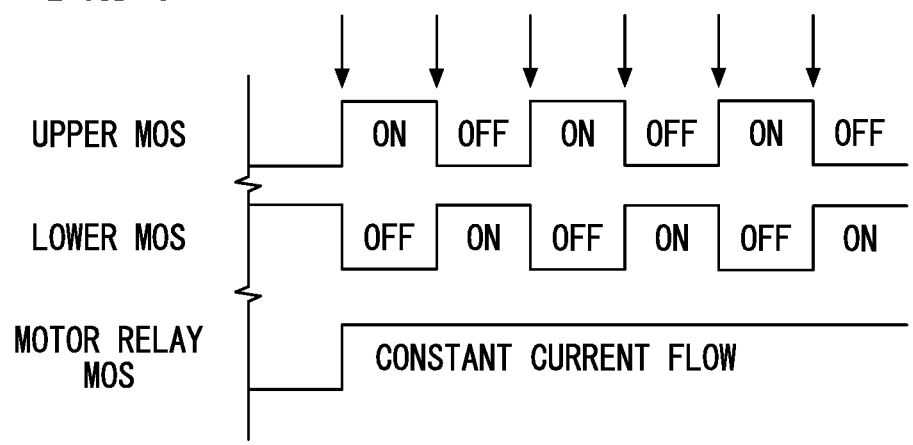
FIG. 8 is a diagram showing a temporal change in current in an on-off fluctuation unit according to the first embodiment.

FIG. 8 is a diagram showing a temporal change of a current flowing through each of the upper MOS, the lower MOS, and the motor relay MOS. The upper MOS is a switching element 121 of the upper arm H (corresponding to an upper switch element). The lower MOS is a switching element 124 of the lower arm L (corresponding to a lower switch element). The motor relay MOS is the motor relay 127. As shown in the drawing, the upper MOS and the lower MOS alternately turn on and off during the motor driving period. Therefore, the current flowing through the upper MOS and the current flowing through the lower MOS fluctuate so that an on-period and an off-period are periodically switched to each other.

In the upper pattern P122 and the midpoint pattern P123 of the on-off fluctuation unit, the current fluctuates in the same manner as in the upper MOS. In the lower pattern P132, the shunt resistor 137, and the lower pattern P133 among the on-off fluctuation units described above, the current fluctuates in the same manner as in the lower MOS.

On the other hand, the motor relay MOS is constantly turned on during the motor driving period unless an abnormality occurs in the motor 80 or the like. In the motor relay MOS, a current flowing through the upper MOS and a current flowing through the lower MOS alternately flow. For that reason, while the current fluctuates on and off in the upper MOS and the lower MOS, a constant current flows in the motor relay MOS as shown in a lower part of FIG. 8. In the output-patterns P124 and P125, a constant current flows in the same manner as in the motor relay MOS. The output patterns P124 and P125 and the motor relay MOS are portions where a current output from the on-off fluctuation unit flows, and correspond to an "output unit".

The upper line P121 and the lower line P131 are portions for supplying an electric power to the on-off fluctuation unit, and correspond to a "power supply unit". In the power supply unit, the current does not fluctuate as in the on-off fluctuation unit.

The on-off fluctuation unit is disposed between the power supply unit and the output unit when viewed from the plate surface perpendicular direction. More specifically, a portion of the lower arm L (including shunt resistors) for three phases in the on-off fluctuation unit is disposed between the power supply patterns P11 and P22 and the motor relays 127 to 229.

Hereinafter, the placement of the above components will be described in detail. The substrate 30 is partitioned into a region of the first system L1 and a region of the second system L2. The boundaries of those regions are linear, for example, the linear slit 305 is a boundary of the compartments. In the direction perpendicular to the boundary line (slit 305), the power supply unit, the on-off fluctuation unit, and the output unit are arrayed in order when viewed from the plate surface perpendicular direction. The power supply unit is disposed at a side closer to the boundary line than the output unit. The output unit is disposed closer to the outer peripheral edge than the power supply portion.

The shunt resistors 137 to 239 are disposed at positions outside the region between the switching elements 124 to 226 of the lower arm L and the output unit when viewed from the plate surface perpendicular direction. More specifically, the shunt resistors 137 to 239 are disposed at positions outside the region between the switching elements 121 to 223 of the upper arm H and the switching elements 124 to 226 of the lower arm L when viewed from the plate surface perpendicular direction.

(Details of Transmission Pattern)

The transmission patterns Prh and Prg transmit detection signals detected by the shunt resistors 137 to 239 to the microcomputers 170 and 270. The transmission pattern Prh transmits a potential on the high potential side of the shunt resistor 137 to the microcomputers 170 and 270 as a detection signal. The transmission pattern Prg transmits a potential on the low potential side of the shunt resistor 137 to the microcomputers 170 and 270 as a detection signal.

Figure 7:
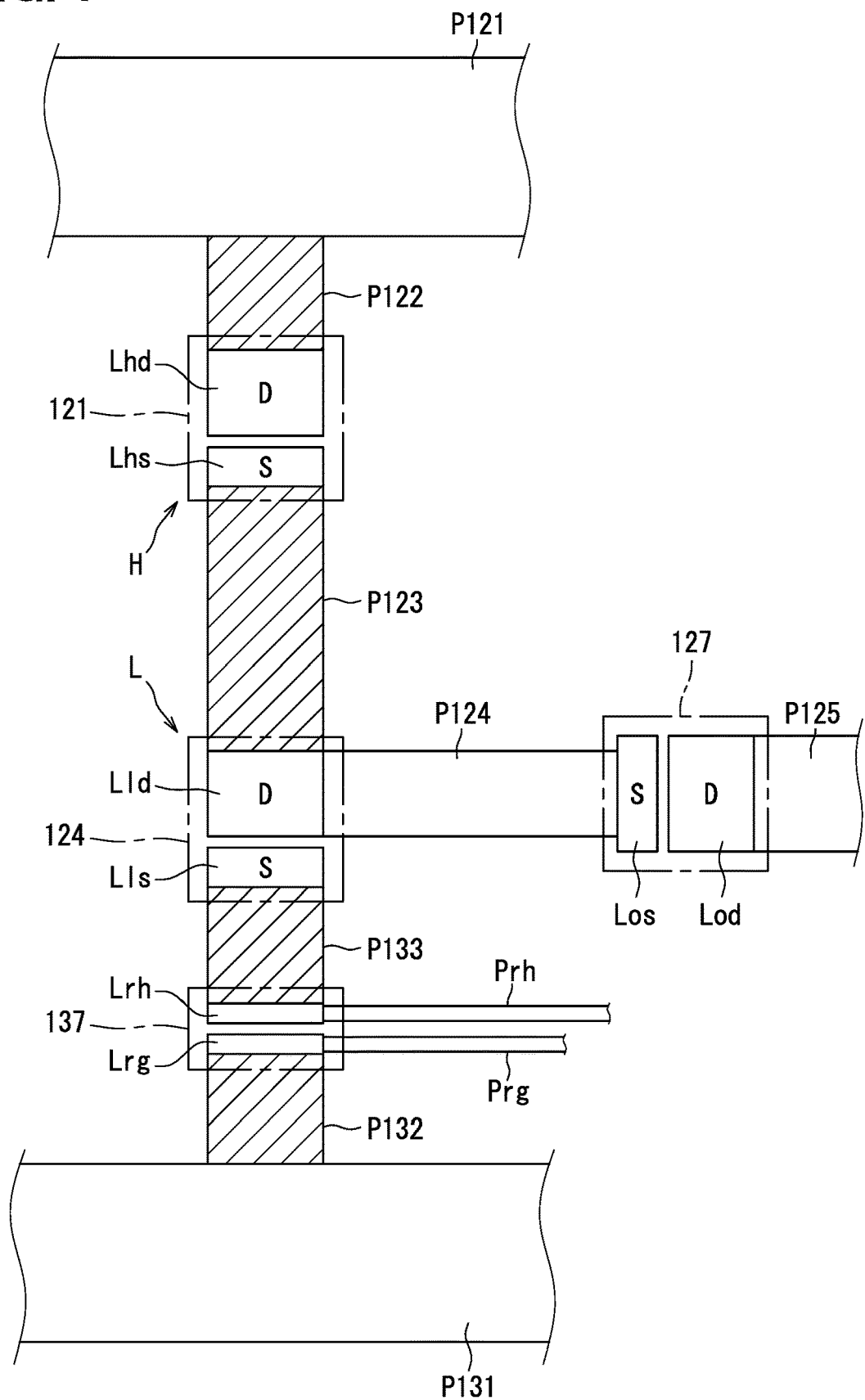
FIG. 7 is a diagram schematically showing a placement of a printed wiring according to a first embodiment.

One end of the transmission pattern Prh is connected to the lower pattern P133, and one end of the transmission pattern Prg is connected to the lower pattern P132. In FIG. 7, one end of the transmission pattern Prh is connected to the high-potential side land portion Lrh of the lower pattern P133. One end of the transmission pattern Prg is connected to the low-potential side land portion Lrg of the lower pattern P132.

Figure 9:
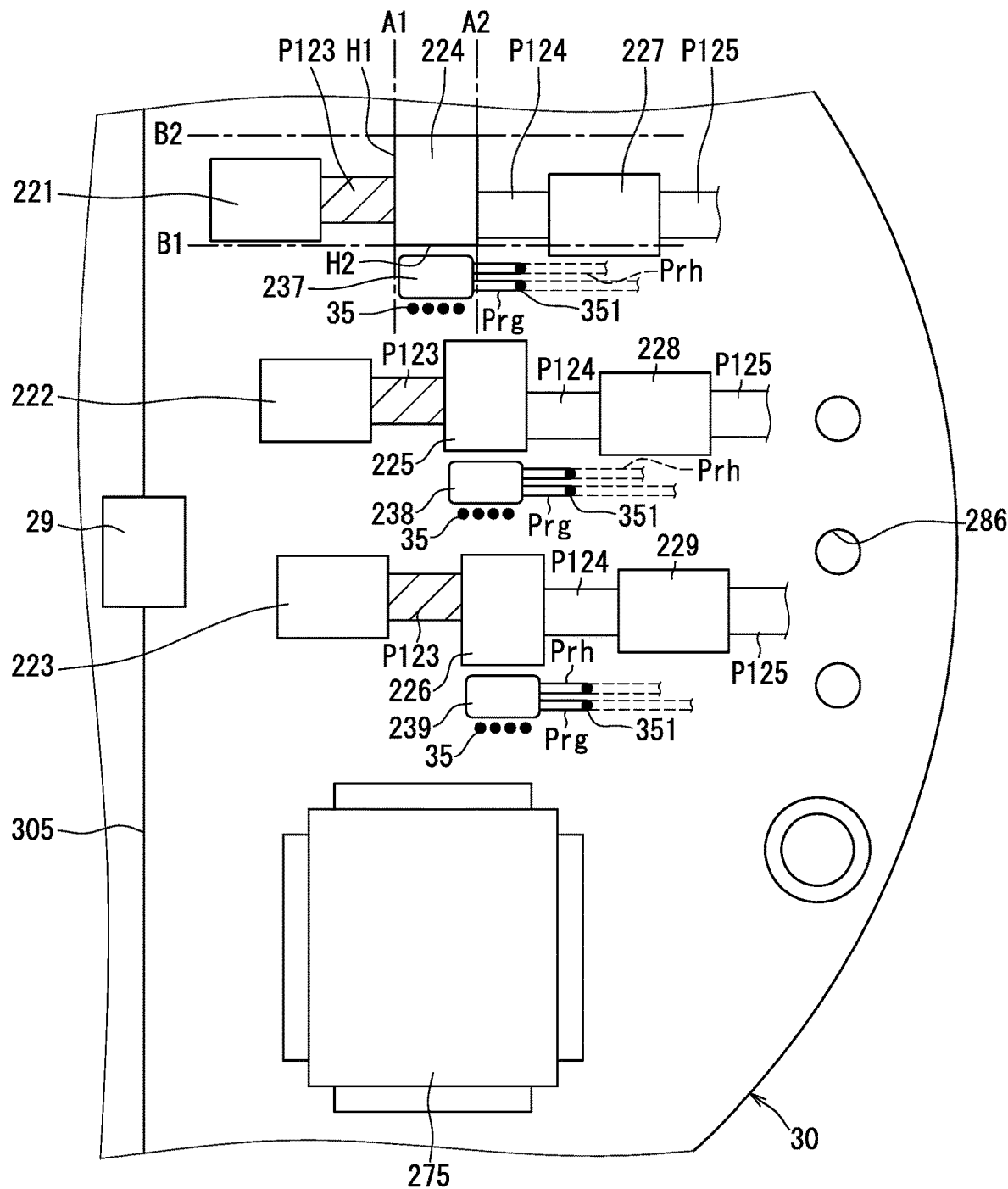
FIG. 9 is an enlarged view of FIG. 4.

As shown in FIG. 9, the upper MOS, the lower MOS, the motor relay MOS, and the shunt resistors 137 to 239 have a rectangular shape when viewed from the plate surface perpendicular direction. Those components are mounted in a direction in which one side of each rectangle is parallel. In an example of FIG. 9, one side of the rectangle is parallel to a boundary straight line (slit 305) of the substrate 30.

A side of the lower MOS facing the upper MOS is referred to as a first side H1, and a side of the lower MOS orthogonal to the first side H1 is referred to as a second side H2. The shunt resistor 237 corresponding to the lower MOS is disposed at a position facing the second side H2. Further, the shunt resistor 237 is disposed in a region between a virtual line A1 extending along the first side H1 and a virtual line A2 extending along the side parallel to the first side H1.

In the example of FIG. 9, the entire shunt resistor 237 is disposed in the region between the virtual lines A1 and A2, but a part of the shunt resistor 237 may be disposed in the region. However, it is preferable that the shunt resistor 237 is disposed at a position different from the region between the virtual lines B1 and B2. The virtual line B1 extends along the second side H2, and the virtual line B2 extends along the side parallel to the second side H2.

The direction in which the high-potential side land portion Lrh and the low-potential side land portion Lrg are aligned coincides with the direction of the current flowing through the shunt resistor 237, and is also referred to as a detection current direction. The shunt resistor 237 is disposed so that the detection current direction intersects with (for example, orthogonal to) the direction in which the lower MOS and the upper MOS are aligned. The direction in which the shunt resistor 237 and the lower MOS are aligned intersects with (for example, orthogonal to) the direction in which the upper MOS and the lower MOS are aligned.

The direction in which the transmission pattern Prh extends from the high-potential side land portion Lrh intersects with (for example, orthogonal to) the detection current direction. The direction in which the transmission pattern Prg extends from the low-potential side land portion Lrg intersects with (for example, orthogonal to) the detection current direction. The directions in which the transmission patterns Prh and Prg extend intersect with (for example, orthogonal to) the boundary straight line (slit 305).

The upper MOS and the motor relay MOS corresponding to the lower MOS are disposed in a region between the virtual lines B1 and B2. The upper MOS and the motor relay MOS may be entirely disposed in a region between the virtual lines B1 and B2, or may be partially disposed in the region.

The transmission patterns Prh and Prg are disposed on both the surface layer and the inner layer of the substrate 30. The transmission patterns Prh and Prg located on the surface layer and the transmission patterns Prh and Prg located on the inner layer are connected to each other by the solid vias 351 (see FIG. 9). A wiring length of portions of the transmission patterns Prh and Prg located on the surface layer is shorter than a wiring length of portions located on the inner layer.

In each of the transmission patterns Prh and Prg of the surface layer and the transmission patterns Prh and Prg of the inner layer, the whole of those transmission patterns is disposed at a position different from the on-off fluctuation unit when viewed from the plate surface perpendicular direction. In other words, the transmission patterns Prh and Prg are disposed so as not to overlap with the on-off fluctuation unit when viewed from the plate surface perpendicular direction. In the present embodiment, the entire transmission patterns Prh and Prg are disposed so as not to overlap with the on-off fluctuation unit when viewed from the plate surface perpendicular direction.

In each of the transmission patterns Prh and Prg of the surface layer and the transmission patterns Prh and Prg of the inner layer, the whole of those transmission patterns is also disposed at a position different from the output unit when viewed from the plate surface perpendicular direction. In other words, the transmission patterns Prh and Prg are also disposed so as not to overlap with the output unit when viewed from the plate surface perpendicular direction. In the present embodiment, the entire transmission patterns Prh and Prg are disposed so as not to overlap with the output unit when viewed from the plate surface perpendicular direction.

According to the present embodiment, the power conversion circuit, the current detection circuit, and the control circuit are provided on one substrate 30, and a multilayer substrate is used for the substrate 30. For that reason, the printed wiring patterns of the circuits can be disposed so as to overlap with each other when viewed from the plate surface perpendicular direction of the substrate 30. This makes it possible to miniaturize the device. However, with a reduction in the size in the above manner, the control wiring patterns such as the transmission patterns Prh and Prg and the power wiring patterns are densely placed. In the present embodiment, measures are taken to prevent deterioration in accuracy of the current detection due to the dense placement.

In the power conversion circuit, there are an on-off fluctuation unit and a portion (non-fluctuation unit) through which a constant current flows at all times. Specific examples of the non-fluctuation unit include the power supply units such as the upper line P121 and the lower line P131, and the output units such as the output patterns P124 and P125 and the motor relay MOS. In the situation of the dense placement, it is effective as noise countermeasures to prevent the transmission patterns Prh and Prg from being overlapped with the on-off fluctuation unit when viewed from the plate surface perpendicular direction. According to the present embodiment, the whole of the transmission patterns Prh and Prg included in the printed wirings are disposed at positions different from the on-off fluctuation unit when viewed from the plate surface perpendicular direction. For that reason, noise caused by the influence of the on-off fluctuation unit can be inhibited from occurring in the detection signal transmitted in the transmission patterns Prh and Prg. Therefore, the deterioration of the accuracy of the current detection can be inhibited while reducing the size of the power conversion device.

A current flows through the shunt resistor in a direction in which the high-potential side land portion Lrh and the low-potential side land portion Lrg are aligned. Since a magnetic flux is generated around the detection current direction in which the current flows (detection current direction) and along the periphery of the detection current direction, noise is likely to occur in a pattern extending in parallel with the detection current direction. In view of the above point, in the present embodiment, the direction in which the transmission pattern Prh extends from the high-potential side land portion Lrh intersects with the detection current direction. In the same manner, the direction in which the transmission pattern Prg extends from the low-potential side land portion Lrg intersects with the detection current direction. This makes it possible to promote a reduction in the noise generated in the transmission patterns Prh and Prg.

Further, in the present embodiment, the direction in which the shunt resistor and the lower MOS are aligned intersects with the direction in which the upper MOS and the lower MOS are aligned (see FIG. 9). This makes it possible to promote a reduction in the noise generated in the transmission patterns Prh and Prg.

Further, in the present embodiment, the upper MOS, the lower MOS, the motor relay MOS, and the shunt resistors 137 to 239 have a rectangular shape when viewed from the plate surface perpendicular direction. A side of the lower MOS facing the upper MOS is defined as a first side H1, and a side of the lower MOS orthogonal to the first side H1 is defined as a second side H2. The shunt resistor is disposed at a position facing the second side H2. This makes it possible to promote a reduction in the noise generated in the transmission patterns Prh and Prg.

Further, in the present embodiment, one end of the output pattern P124 is connected to the switch land portion Lld. According to the above configuration, the degree of freedom of layout of the transmission patterns Prh and Prg can be improved as compared with the case where one end of the output pattern P124 is connected to the midpoint pattern P123.

Further, in the present embodiment, a wiring length of portions of the transmission patterns Prh and Prg located on the surface layers 31 and 32 of the substrate 30 is shorter than the wiring length of the portions located on the inner layers 33. The electronic components included in the on-off fluctuation unit are surface-mounted. For that reason, the portions of the transmission patterns Prh and Prg located in the inner layer 33 are less susceptible to the influence of the on-off fluctuation unit than the portions located in the surface layers 31 and 32. Therefore, according to the present embodiment, the reduction of noise generated in the transmission patterns Prh and Prg can be promoted.

Further, in the present embodiment, the electric power conversion circuit supplies an electric power to the motor 80 of the EPS 8 which exhibits a steering force of the vehicle. Since the motor 80 for the EPS 8 has a characteristic that a large current flows instantaneously, the emission noises are likely to occur. For that reason, the effect of inhibiting the emission noise according to the present embodiment is suitably exhibited.

According to the present embodiment, in the first system L1, the power supply patterns P11 and P12 corresponding to the first layer power supply pattern portion and the ground pattern P13 corresponding to the second layer ground pattern portion are disposed so as to overlap with each other when viewed from the plate surface perpendicular direction. For that reason, a loop formed by the power supply patterns P11 and P12 and the ground pattern P13 is reduced when viewed from the plate surface perpendicular direction. For that reason, a loop formed by the power supply patterns P11 and P12 and the ground pattern P13 is reduced when viewed from the plate surface perpendicular direction.

In the same manner, in the second system L2, the power supply patterns P21 and P22 corresponding to the first layer power supply pattern portion and the ground pattern P23 corresponding to the second layer ground pattern portion are disposed so as to overlap with each other when viewed from the plate surface perpendicular direction. For that reason, a loop formed by the power supply patterns P21 and P22 and the ground pattern P23 is reduced when viewed from the plate surface perpendicular direction.

Therefore, in each system, both the loop-shaped patterns can be inhibited from functioning as an antenna. For that reason, the noise generated by the switching of the inverter circuit can be inhibited from being emitted as emission noise which is an electromagnetic wave. In addition to the switching noise described above, an electromagnetic wave noise caused by a large current flowing in both of the patterns is also inhibited by a reduction of the loop.

In the wiring of the power wiring patterns P11 to P23, it may be preferable to increase the thickness of the wiring to lower the impedance in order to reduce heat generation caused by a large current flow. When the wiring is thickened, a wiring width and a wiring gap may become large due to a substrate manufacturing restriction, and a fine wiring cannot be formed. For that reason, it may be unsuitable to wire the control wiring patterns P18 and P19 requiring a high density layout. Therefore, when both the power conversion circuit and the control circuit are provided on the same substrate to achieve miniaturization, the power wiring pattern and the control wiring pattern are mixed on the same substrate. Therefore, both a reduction in impedance and a miniaturization of wiring may be required.

According to the present embodiment, a multilayer substrate is used as the substrate 30 on which both of the power wiring patterns P11 to P23 and the control wiring patterns P18 and P19 are provided. The power wiring patterns disposed in different layers of the multilayer substrate are electrically connected to each other by solid conductive members (solid vias 35) provided in the vias 35a.

This makes it possible to make the power wiring pattern of multiple layers have an impedance equivalent to that of a single layer of thick wiring. In addition, since the via is a solid via, the impedance can be further reduced as compared with the case of a film via. In other words, the impedance can be lowered without thickening the power wiring pattern, and heat generation caused by a large current flowing through the power wiring pattern can be reduced. In addition, since the power wiring pattern can be inhibited from being thickened, the wiring widths and wiring gaps of the control wiring patterns P18 and P19 can be reduced, and fine wiring can be achieved.

Second Embodiment

Figure 10:
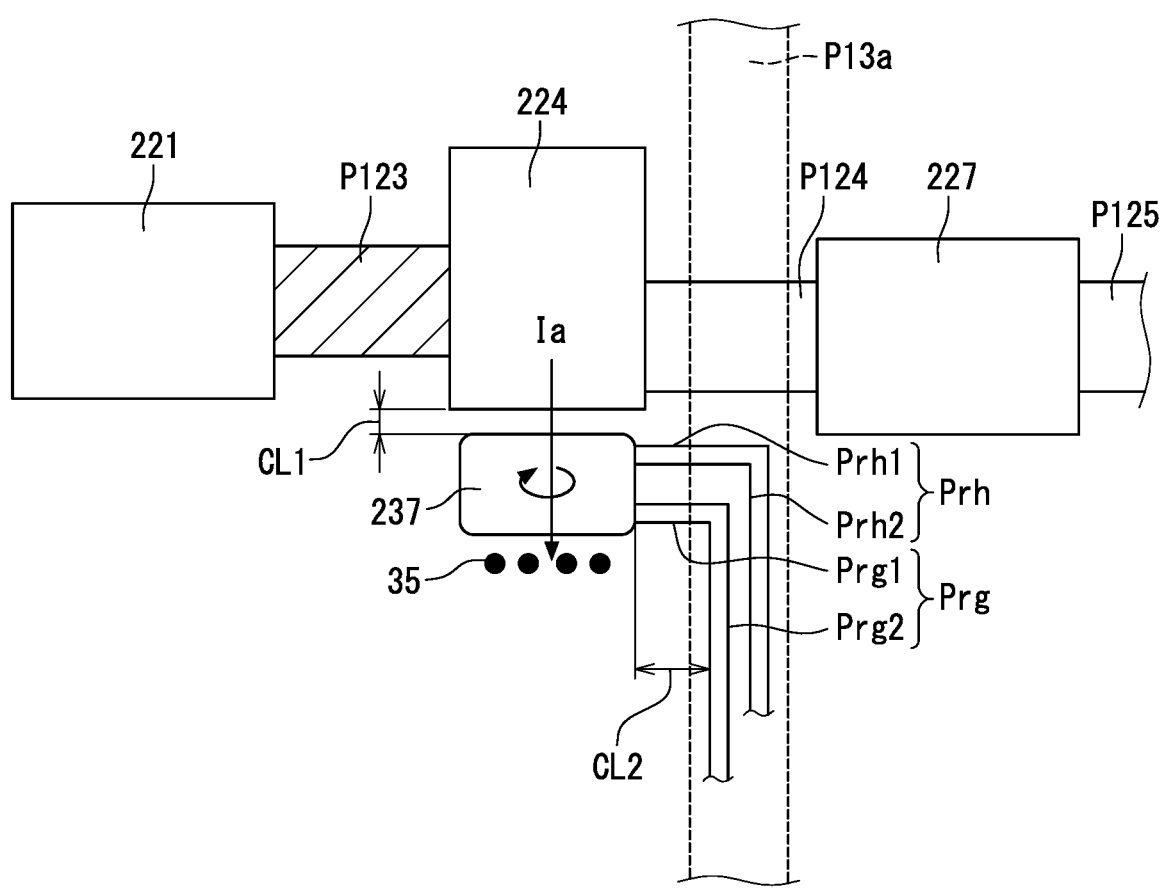
FIG. 10 is a diagram schematically showing a shape and placement of a transmission pattern in a printed wiring according to a second embodiment.

In the present embodiment shown in FIG. 10, shapes of transmission patterns Prh and Prg are changed as follows.

The transmission patterns Prh and Prg include first pattern portions Prh1 and Prg1 and second pattern portions Prh2 and Prg2. The first pattern portions Prh1 and Prg1 are shaped to extend linearly with one ends connected to the high-potential side land portion Lrh or the low-potential side land portion Lrg. The direction in which the first pattern portions Prh1 and Prg1 extend is a direction intersecting with (for example, perpendicular to) the detection current direction. An arrow Ia in the drawing indicates a direction in which the high-potential side land portion Lrh and the low-potential side land portion Lrg are aligned, and indicates a direction in which a current flows through the shunt resistor (detection current direction).

The second pattern portions Prh2 and Prg2 are shaped to extend linearly with their directions changed from the other ends of the first pattern portions Prh1 and Prg1 and extend linearly. The direction in which the second pattern portions Prh2 and Prg2 extend is a direction parallel to the detection current direction.

At least a part of the second pattern portions Prh2 and Prg2 is disposed so as to overlap with at least a part of another pattern P13a when viewed from the plate surface perpendicular direction of the substrate 30. The other pattern P13a is a printed wiring different from the on-off fluctuation unit (see FIG. 10). In the case of FIG. 10, the other pattern P13a is a ground pattern in which the on-off fluctuation of a current does not occur such as the on-off fluctuation unit.

As described in the first embodiment, noise is likely to occur in portions of the transmission patterns Prh and Prg extending in parallel with the detection current direction. On the other hand, in the present embodiment, another pattern P13a is superposed on the second pattern portions Prh2 and Prg2 in which noises are apt to occur. For that reason, another pattern P13a exhibits a noise shielding effect on the second pattern portions Prh2 and Prg2. This makes it possible to promote a reduction in the noise generated in the transmission patterns Prh and Prg.

Modified Embodiment

The first pattern portions Prh1 and Prg1 are shaped to extend linearly with one ends connected to the high-potential side land portion Lrh or the low-potential side land portion Lrg. The direction in which the first pattern portions Prh1 and Prg1 extend may be a direction intersecting with (for example, perpendicular to) the detection current direction. The second pattern portions Prh2 and Prg2 may be shaped to extend with one ends connected to the high-potential side land portion Lrh or the low-potential side land portion Lrg. In the second pattern portions Prh2 and Prg2, the portion extending from the shunt resistor may extend in parallel with the direction in which the first pattern portions Prh1 and Prg1 extend, and the extension direction of the second pattern portions Prh2 and Prg2 changes at a position overlapping with the above-described another pattern P13a to extend a direction in parallel with the detection current direction. According this configuration, it is possible to promote a reduction in the noise generated in the transmission patterns Prh and Prg.

Third Embodiment

Figure 11:
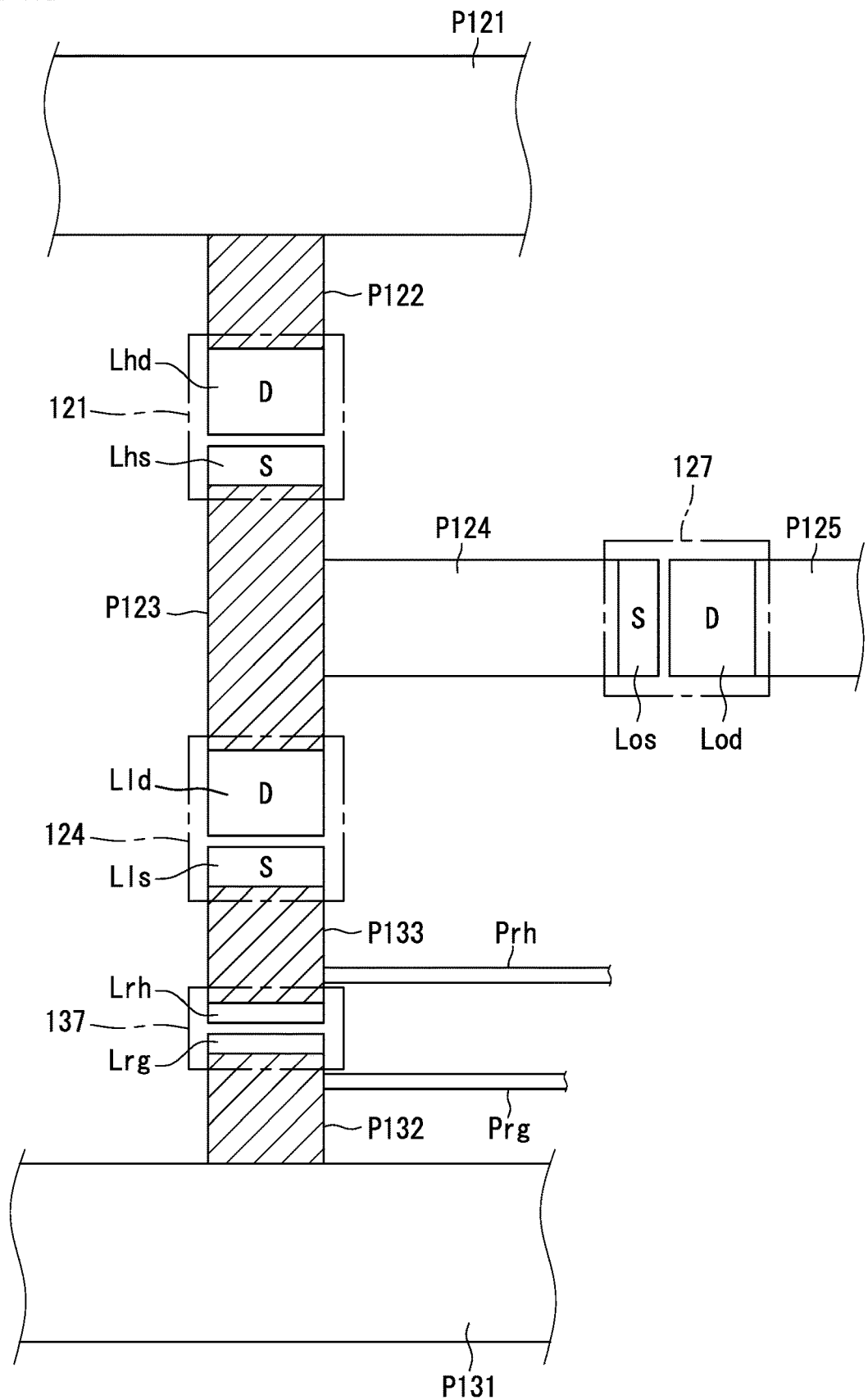
FIG. 11 is a diagram schematically showing a placement of an output pattern and a transmission pattern in a printed wiring according to a third embodiment.

In the first embodiment, as shown in FIG. 7, the output pattern P124 branches from the switch land portion Lld of the on-off fluctuation unit. On the other hand, in the present embodiment, as shown in FIG. 11, the output pattern P124 branches from a portion of the midpoint pattern P123 excluding the switch land portions Lld and Lhs.

In the first embodiment, the transmission patterns Prh and Prg branch from the high-potential side land portion Lrh and the low-potential side land portion Lrg of the on-off fluctuation unit. On the other hand, in the present embodiment, the transmission pattern Prg branches from a portion of the lower pattern P132 except for the low-potential side land portion Lrg. Further, the transmission pattern Prh branches from a portion of the lower pattern P133 except for the high-potential side land portion Lrh.

OTHER EMBODIMENTS

Although multiple embodiments of the present disclosure have been described above, not only the combinations of the configurations explicitly shown in the description of each embodiment, but also the configurations of multiple embodiments can be partially combined even if the combination is not explicitly shown if there is no problem in the combination in particular. Unspecified combinations of the configurations described in the multiple embodiments and the modification examples are also disclosed in the following description.

In each of the above embodiments, the other ends of the transmission patterns Prh and Prg are connected to the microcomputers 170 and 270. On the other hand, the other ends of the transmission patterns Prh and Prg may be connected to the integrated IC 175 and IC 275. In this case, for example, the integrated IC 175 and IC 275 transmits the current detection signal to the microcomputers 170 and 270 with amplification and noise cancellation of the current detection signal. In this instance, the microcomputers 170 and 270 and the integrated IC 175 and IC 275 correspond to a control circuit.

In the first embodiment, the whole of the transmission patterns Prh and Prg is disposed at a position different from the output patterns P124 and P125 and the motor relay 127 when viewed from a plate surface perpendicular direction. On the other hand, some of the transmission patterns Prh and Prg may be disposed so as not to overlap with the output patterns P124 and P125 and the motor relay 127.

In the example of FIG. 7, one end of the output pattern P124 is connected to the switch land portion Lld of the lower MOS. On the other hand, one end of the output pattern P124 may be connected to the switch land portion Lhs of the upper MOS.

In the first embodiment, the solid vias 351 are overlapped with the ground patterns P13 and P23 when viewed from the plate surface perpendicular direction. On the other hand, the solid vias 351 may be disposed at positions different from those of the ground patterns P13 and P23 when viewed from the plate surface perpendicular direction.

In the first embodiment, the current detection circuit is provided by a shunt resistor. In contrast, the current detection circuit may be provided by a current sensor that detects a change in magnetic flux in response to a current.

In the first embodiment, a direction in which the transmission pattern Prh extends from the high-potential side land portion Lrh intersects with the detection current direction. On the other hand, the direction in which the transmission pattern Prh extends from the high-potential side land portion Lrh may be parallel to the detection current direction. In the same manner, the direction in which the transmission pattern Prg extends from the low-potential side land portion Lrg may be parallel to the detection current direction.

In the first embodiment, the direction in which the shunt resistor and the lower MOS are aligned intersects with the direction in which the upper MOS and the lower MOS are aligned. On the other hand, the direction in which the shunt resistor and the lower MOS are aligned may be parallel to the direction in which the upper MOS and the lower MOS are aligned.

In the first embodiment, the shunt resistor is disposed at a position facing the second side H2 of the lower MOS, but may be disposed at a position facing the first side H1 of the lower MOS.

In the first embodiment, a wiring length of portions of the transmission patterns Prh and Prg located on the surface layers 31 and 32 of the substrate 30 is shorter than the wiring length of the portions located on the inner layers 33. On the other hand, a wiring length of the portions of the substrate 30 located on the surface layers 31 and 32 may be longer than a wiring length of the portions of the substrate 30 located on the inner layers 33.

In the example shown in FIG. 2, the opening 837a is provided in the rear frame end 837, and the rotation shaft 870 is inserted through the opening 837a. The magnet 875 attached to the tip of the rotation shaft 870 is exposed from the opening 837a and faces the rotation angle sensor 29. On the other hand, the opening 837a may be eliminated, and a part of the rear frame end 837 may be interposed between the rotation angle sensor 29 and the magnet 875. However, even in this case, it is desirable to dispose the rotation angle sensor 29 on the center line Ax of the rotation shaft 870.

In the embodiment shown in FIG. 1, the power conversion device includes the motor 80 for the EPS 8 motor 80 as a power supply target. On the other hand, another motor, such as a motor for vehicle travel, may be a power supply target. In the first embodiment, a circuit configuring the inverters 120 and 220 is applied to the power conversion circuit provided on the substrate 30, but a boosting circuit may be applied.

In the embodiment shown in FIG. 3, the components configuring the first system L1 and the components configuring the second system L2 in the drive device 1 are mounted on a single substrate 30. On the other hand, the components of the first system L1 and the components of the second system L2 may be separately mounted on multiple substrates. The components of the first system L1 include the first inverter 120, the first motor relays 127 to 129, the first power supply relays 131 and 132, the first capacitor 134, the first coil 135, and the like. The components of the second system L2 include the second inverter 220, the second motor relays 227 to 229, the second power supply relays 231 and 232, the second capacitor 234, and the second coil 235.

In the embodiment shown in FIG. 3, the switching elements 121 to 126, the motor relays 127 to 129, and the power supply relays 131, 132 are all MOSFET. On the other hand, an IGBT, a thyristor, or the like may be used. The power supply relays 131 and 132 may be mechanical relays. The second system L2 may be an IGBT, a thyristor, or a mechanical relay instead of the MOSFET in the same manner as the first system L1.

Although the embodiment shown in FIG. 3 includes an inter-system ground connection capacitor 41, the inter-system ground connection capacitor 41 may be eliminated. Although the embodiment shown in FIG. 3 includes electromechanical connection capacitors 142 and 242, those electromechanical connection capacitors 142 and 242 may be eliminated. In this case, it may be omitted that the ground pattern for each system or the power supply pattern for each system is divided and disposed in each region separated by the slit 305.

The inter-system ground connection capacitor 41 is mounted on the substrate 30 and electrically connects the ground of each system. This makes it possible to form a path for feeding back the noise propagated to the other system side through the motor windings 180 and 280 and the like to the host system on the substrate 30. The electromechanical connection capacitors 142 and 242 connect the housing connection patterns 156, 157, 256, and 257 to the ground pattern of the substrate 30. This makes it possible to form a low-impedance path for feeding back the noises propagated to the motor 80 side to the ECU 10 including the inverters 120 and 220. Therefore, the propagation of noise to the outside of the drive device 1, such as a vehicle, can be reduced.

In the first embodiment, a control circuit is provided for each of the power conversion circuits of the two systems, and the control circuit is also configured in two systems. On the other hand, a control circuit may be common to each of the power conversion circuits of the two systems, and the control circuit may be configured as a single system. In addition, all the circuits including the power conversion circuit may be configured as one system.

The inverter 120 corresponds to a power conversion circuit. The inverter 220 corresponds to a power conversion circuit. Each of the shunt resistors 137, 138, 139, 237, 238, and 239 corresponds to a current detection circuit. Each of the microcomputers 170 and 270 corresponds to a control circuit.

While various embodiments, configurations, and aspects of a power conversion device according to the present disclosure have been exemplified, the embodiments, configurations, and aspects of the present disclosure are not limited to those described above. For example, embodiments, configurations, and aspects obtained from an appropriate combination of technical elements disclosed in different embodiments, configurations, and aspects are also included within the scope of the embodiments, configurations, and aspects of the present disclosure.

What is claimed is:

1. A power conversion device comprising:
   a power conversion circuit that is configured to convert a supplied electric power to output the converted power;
   a current detection circuit that is configured to detect a current flowing through the power conversion circuit;
   a control circuit that is configured to control an operation of the power conversion circuit based on a current value detected by the current detection circuit; and
   a multilayer substrate that is provided with the power conversion circuit, the current detection circuit, and the control circuit,
   wherein:
   the multilayer substrate includes a printed wiring;
   the printed wiring includes a transmission pattern that transmits a detection signal detected by the current detection circuit to the control circuit;
   an on-off fluctuation unit of the power conversion circuit fluctuates to switch on and off a current; and
   whole of the transmission pattern is disposed at a position different from the on-off fluctuation unit in a direction perpendicular to a plate surface of the multilayer substrate.

2. The power conversion device according to claim 1, wherein:

the power conversion circuit includes an upper arm connected to an upper line that is a high potential side of a power supply line, and a lower arm connected to a lower line that is a low potential side of the power supply line;

the printed wiring includes an upper pattern, a lower pattern, and a midpoint pattern;

the upper pattern connects an upper switch element provided on the upper arm to the upper line;

the lower pattern connects a lower switch element provided on the lower arm to the lower line;

the midpoint pattern connects the upper switch element to the lower switch element; and the on-off fluctuation unit includes the upper pattern, the lower pattern, the upper switch element, the lower switch element, and the midpoint pattern.

3. The power conversion device according to claim 2, wherein:

the current detection circuit includes a shunt resistor having a high potential side and a low potential side;

the lower pattern includes a high-potential side land portion on which the high potential side of the shunt resistor is mounted, and a low-potential side land portion on which the low potential side of the shunt resistor is mounted; and a direction in which the transmission pattern extends from the high-potential side land portion or the low-potential side land portion intersects with a detection current direction in which the high-potential side land portion and the low-potential side land portion are aligned.

4. The power conversion device according to claim 3, wherein:

the transmission pattern includes a first pattern portion and a second pattern portion;

the first pattern portion linearly extends, and one end of the first pattern portion is connected to the high-potential side land portion or the low-potential side land portion;

a direction in which the first pattern portion extends intersects with the detection current direction;

the second pattern portion linearly extends with extension direction of the second pattern portion changed from the other end of the first pattern portion; and at least a part of the second pattern portion is disposed to overlap with at least a part of a different pattern that is a printed wiring different from the on-off fluctuation unit, in the direction perpendicular to the plate surface of the multilayer substrate.

5. The power conversion device according to claim 2, wherein:

a direction in which the current detection circuit and the lower switch element are aligned intersects with a direction in which the upper switch element and the lower switch element are aligned.

6. The power conversion device according to claim 3, wherein:

the shunt resistor, the upper switch element, and the lower switch element each has a rectangular shape in the direction perpendicular to the plate surface of the multilayer substrate;

a first side of the lower switch element faces the upper switch element;

a second side of the lower switch element is perpendicular to the first side; and the shunt resistor is disposed at a position facing the second side.

7. The power conversion device according to claim 2, wherein:

the printed wiring includes an output pattern outputting an electric power converted by the power conversion circuit;

the midpoint pattern includes a switch land portion on which the upper switch element or the lower switch element is mounted; and one end of the output pattern is connected to the switch land portion.

8. The power conversion device according to claim 1, wherein:

the multilayer substrate has a surface layer and an inner layer;

a wiring length of the transmission pattern located on the surface layer is shorter than a wiring length of the transmission pattern located on the inner layer.

9. The power conversion device according to claim 1, wherein:

the power conversion circuit supplies an electric power to a motor that exerts a steering force of a vehicle.

* * * * *